United States Patent
Sahajwalla

(10) Patent No.: US 11,884,992 B2
(45) Date of Patent: Jan. 30, 2024

(54) METHOD, APPARATUS AND SYSTEM FOR PROCESSING A COMPOSITE WASTE SOURCE

(71) Applicant: NewSouth Innovations Pty Limited, Sydney (AU)

(72) Inventor: Veena Sahajwalla, Sydney (AU)

(73) Assignee: NewSouth Innovations Pty Limited, New South Wales (AU)

( * ) Notice: Subject to any disclaimer, the term of this patent is extended or adjusted under 35 U.S.C. 154(b) by 1071 days.

(21) Appl. No.: 16/076,289

(22) PCT Filed: Feb. 8, 2017

(86) PCT No.: PCT/AU2017/050098
§ 371 (c)(1),
(2) Date: Aug. 7, 2018

(87) PCT Pub. No.: WO2017/136881
PCT Pub. Date: Aug. 17, 2017

(65) Prior Publication Data
US 2021/0189520 A1    Jun. 24, 2021

Related U.S. Application Data

(60) Provisional application No. 62/388,851, filed on Feb. 8, 2016.

(51) Int. Cl.
C22B 11/02 (2006.01)
C22B 7/00 (2006.01)
(Continued)

(52) U.S. Cl.
CPC ............ C22B 11/025 (2013.01); C22B 7/004 (2013.01); C22B 13/025 (2013.01);
(Continued)

(58) Field of Classification Search
CPC .. C22B 1/00; C22B 1/005; C22B 1/02; C22B 1/248; C22B 5/00; C22B 5/02;
(Continued)

(56) References Cited

U.S. PATENT DOCUMENTS 5,350,438 A * 9/1994 Okada .................... C22B 1/005
75/401
5,619,934 A   4/1997 Yen
(Continued)

FOREIGN PATENT DOCUMENTS

CL   2007003141 A1   5/2008
CL   2015001819 A1   10/2015
(Continued)

OTHER PUBLICATIONS

Manual on the Use of Thermocouples in Temperature Measurement (4th Edition): (MNL 12)—5.3 Insulation., ASTM International, 1993. (pp. 111). (Year: 1993).*
(Continued)

*Primary Examiner* — Vanessa T. Luk
*Assistant Examiner* — Nikolas Takuya Pullen
(74) *Attorney, Agent, or Firm* — K&L Gates LLP; Louis C. Cullman; Giorgios N. Kefallinos

(57) ABSTRACT

A method, apparatus and system for processing a composite waste source, such as e-waste, is disclosed. The composite waste source may comprise low-, moderate and high-melting point constituents, such as plastics, metals and ceramics. The composite waste source is heated to a first temperature zone, causing at least some of the low-melting point constituents to at least partially thermally transform. The composite waste source is subsequently heated to a second, higher, temperature zone, causing at least some of the moderate-melting point constituents to at least partially thermally transform. At least some of the at least partially
(Continued)

thermally transformed constituents may be recovered. The method, apparatus and system disclosed may provide for the recovery and reuse of materials which would otherwise be sent to landfill or incinerated.

16 Claims, 8 Drawing Sheets

(51) Int. Cl.
- C22B 13/02 (2006.01)
- C22B 15/00 (2006.01)
- C22B 25/02 (2006.01)
- H05K 3/22 (2006.01)

(52) U.S. Cl.
CPC .......... C22B 15/0056 (2013.01); C22B 25/02 (2013.01); H05K 3/22 (2013.01); H05K 2203/1105 (2013.01); H05K 2203/178 (2013.01)

(58) Field of Classification Search
CPC .... C22B 5/12; C22B 5/14; C22B 5/16; C22B 5/18; C22B 19/30; C22B 21/0007; C22B 21/0069; C22B 21/0092; C22B 34/12; C22B 34/1204; C22B 34/1218; C22B 7/004; C22B 11/02; H05K 2203/178
See application file for complete search history.

(56) References Cited

U.S. PATENT DOCUMENTS

| | | | |
|---|---|---|---|
| 5,735,933 A * | 4/1998 | Yokoyama | C22B 7/001 75/403 |
| 5,843,287 A * | 12/1998 | Wicks | B09B 5/00 204/157.15 |
| 6,143,139 A | 11/2000 | Wicks et al. | |
| 6,332,909 B1 * | 12/2001 | Teshima | C10B 7/14 75/401 |
| 8,518,147 B2 | 8/2013 | Bratina et al. | |
| 2008/0210604 A1 * | 9/2008 | Suetsugu | H05K 13/0465 209/509 |
| 2012/0031235 A1 | 2/2012 | Frame | |
| 2012/0227643 A1 | 9/2012 | Nowottny et al. | |
| 2013/0174694 A1 | 7/2013 | Xu | |

FOREIGN PATENT DOCUMENTS

| | | | |
|---|---|---|---|
| CN | 1834537 A | 9/2006 | |
| CN | 1927480 A | 3/2007 | |
| CN | 104451165 A | 3/2015 | |
| EA | 001735 B1 | 8/2001 | |
| JP | H08-510011 A | 10/1996 | |
| JP | 2007-132654 A | 5/2007 | |
| JP | 2007-196229 A | 8/2007 | |
| JP | 2013-544964 A | 12/2013 | |
| RU | 2518812 C2 | 6/2014 | |
| SU | 743980 A1 | 6/1980 | |
| WO | 1994026941 A1 | 11/1994 | |
| WO | WO-2007077594 A1 * | 7/2007 | ........... C22B 13/025 |
| WO | 2012018811 A2 | 2/2012 | |
| WO | 2012143951 A2 | 10/2012 | |
| WO | 2014/034931 A1 | 3/2014 | |

OTHER PUBLICATIONS

National Center for Biotechnology Information. "PubChem Compound Summary for CID 5359967, Indium" PubChem, Accessed Apr. 27, 2022, p. 6 (Year: 2022).*
D'Agostino, Carmine, et al. Assessing the effect of reducing agents on the selective catalytic reduction of NOx over Ag/Al2O3 catalysts, Oct. 30, 2015, Royal Society of Chemistry, 6, 1661-1666 (Year: 2015).*
Natural Gas Pros and Cons, Feb. 6, 2015 (Year: 2015).*
Natural Gas: Background, Feb. 10, 2014 (Year: 2014).*
Visual Elements Periodic Table Tin, Jan. 24, 2012, Royal Society of Chemistry (Year: 2012).*
Vapor Pressure of the Chemical Elements, Dec. 30, 2012, Power Stream (Year: 2012).*
Office Action, dated Nov. 21, 2019, for Chilean Patent Application No. 201802130 (Original enclosed).
Office Action, dated Oct. 2, 2020, for Russian Patent Application No. 2018131951 (Original and Translation enclosed).
Office Action, dated Sep. 3, 2020, for Japanese Patent Application No. 2018-541128 (Original and Translation enclosed).
Office Action, dated Aug. 14, 2019, for Chinese Patent Application No. 201780021620.5 (Original and Translation enclosed).
Office Action, dated Feb. 25, 2020, for Chinese Patent Application No. 201780021620.5 (Original and Translation enclosed).
ffice Action, dated Aug. 14, 2023, for Korean Patent Application No. 10-2018-7026042 (Original and Translation enclosed).

* cited by examiner

METHOD, APPARATUS AND SYSTEM FOR PROCESSING A COMPOSITE WASTE SOURCE

This application is a national phase entry of PCT/AU2017/050098, filed Feb. 8, 2017, which claims the benefit of U.S. provisional patent application no. 62/388,851, filed Feb. 8, 2016, the entire disclosures each of which is incorporated herein by reference.

TECHNICAL FIELD

A method, apparatus and system for processing a composite waste source is disclosed. The method, apparatus and system may find particular application in the recovery of metals and metal alloys from composite waste sources, and provide a simple method, apparatus and system for recycling composite waste.

BACKGROUND

Internationally, there are increasing problems with the disposal of electronic consumer items. The majority of electronic consumer items, such as televisions, computers, tablets, e-readers and mobile (cell) phones, are made obsolete within about three years from production due to the rapid uptake of information technology with the advent of new designs and technology at regular intervals and intense marketing in the electronics sector. With high consumer demand in affluent countries, and even amongst developing economies, the manufacturing and sales of equipment in the electronics industry is now ~$1 trillion annually, yielding 30-50 million tonnes of obsolete equipment worldwide each year for disposal. Larger household electrical items, such as washing machines, refrigerators, microwaves, etc. may have a longer lifespan than electronic consumer items, but are also difficult to recycle.

Such electronic and electrical items, generally termed e-waste, are difficult to recycle, due to their varied compositions which may contain up to 1000 different substances, with plastics, metals and ceramics being the main constituents. E-waste is also difficult to recycle, or otherwise dispose of in landfill, due to the presence of toxic materials such as lead, cadmium, antimony and flame retardants which can leach into ground water. Additionally, the carbon present in the e-waste in landfill can lead to the release of harmful by-products including greenhouse gases such as methane and carbon dioxide.

One way in which e-waste is currently being recycled is through mechanical processes, such as dismantling and crushing, grinding or shredding the e-waste, and separating various components through density and/or magnetic separation. The separated e-waste can then undergo further chemical treatments. However, due to the complexity of e-waste and widely differing compositions, the material contents of e-waste are not clearly and precisely known and a universal recycling method is not available.

Another way in which e-waste is currently being recycled is through chemical and hydrometallurgical approaches for extracting precious metals or copper, including thermal processes such as pyrolysis, hydration, and metallurgical processes. Recycling may include burning the e-waste, plastic chipping and melting, burning wires to recover copper, and acid and cyanide salt leaching. These recycling processes can release dust particles loaded with heavy metals and flame retardants into the atmosphere. Fumes, ashes and particles generated from burning activities is similar to that of dismantling dust, with toxic pollutants such as dioxins, furans and lead ending up in soil, ground water and the atmosphere. These recycling methods have had limited success, and use a number of process steps that produce large amounts of secondary waste.

As e-waste has generally been treated as an impure waste resource, it has also been processed in metal smelters along with ore (up to 10-15%) for metal recovery. However, the composition of e-waste is significantly different from typical ores, as most metals in e-waste are already present in a refined state. Recycling these refined metals along with ores involves their oxidation and subsequent smelting, reduction and refining. Conventional metallurgical processes, which have been optimised for economical and efficient extraction of desired elements from large amounts of ores, may not be suitable for processing e-waste materials. Combustion of the e-waste is generally conducted under oxidising conditions so that the plastics are burnt away, to allow access to the metals of interest, which results in metallic constituents being lost in the slag phase (molten oxides), which are then difficult to recover.

Several rare earth elements, such as yttrium, neodymium, dysprosium, lanthanum and cerium, are generally present in e-waste, such as in the form of miniature magnets, magnetic brakes, high performance batteries, electric vehicles, smart phones and LCD screens. These components are glued in position with organic binders and are very difficult to physically separate during recycling. These valuable elements are generally lost in the slag phase during recycling of e-waste in metal smelters. Due to very small concentrations and high temperatures required, their recovery has not been economically feasible to date.

Recovery of precious and other metals being the major economic driving force for recycling e-waste, the non-metallic fraction (NMFs) containing plastics and ceramics is treated either by combustion or landfilling. While the combustion of NMFs is known to cause the formation of highly toxic gases, landfilling can cause secondary pollution by the leaching of heavy metals and flame retardants into ground water. As such, one of the main hazards in e-waste arises from the presence of heavy metals, persistent organic pollutants, flame retardants and other potentially hazardous substances.

A reference herein to the prior art does not constitute an admission that the art forms part of the common general knowledge of a person of skill in the art, and is not intended to limit the scope of the method, apparatus and system disclosed herein.

SUMMARY

In a first aspect, a method of processing a composite waste source is disclosed. In the context of this specification, the terminology "composite waste source" or "composite waste" refers to a waste source that potentially comprises plastics, metals, ceramics and/or other trace impurities. In this regard, plastics may include: epoxy and phenolic resins, acrylonitrile butadiene styrene (ABS), high impact polystyrene (HIPS), polyacetate (PA), polymethylmethacrylate (PMMA), polyvinyl chlorides (PVC), thermosetting plastics, and other polymers. Metals may include: base metals, such as copper, aluminium, nickel, tin, zinc and iron, etc.; precious metals, such as gold, silver, palladium and platinum, etc.; rare metals, such as beryllium, tantalum and indium, etc.; rare earth metals, such as yttrium, dysprosium, neodymium, lanthanum, cerium, praseodymium, etc.; and toxic heavy metals, such as lead, cadmium and antimony.

Ceramics may include: oxides, such as silica, alumina and lead oxide; and alumina-silicate, etc.

Exemplary composite waste sources may include so-called electronic waste (or e-waste), which may contain up to 1000 different substances, with plastics, metals and ceramics being the main constituents. Such e-waste can include: consumer/entertainment electronics, such as televisions, DVD players and amplifiers; office, information and communications technology, such as computers, central processing units (CPUs), monitors, notebooks, keyboards, faxes, telephones and mobile (cell) phones, printers and photocopiers (including toners and cartridges); household appliances including refrigerators, washing machines and microwaves; lighting devices including desk lamps and fluorescent tubes; power tools, such as power drills; and sport and leisure equipment, such as fitness machines and remote control cars. Printed Circuit Boards (PCBs), which are mainly used to connect and hold various electrical components, are one such part of these mentioned electrical items suitable for use in the disclosed method which, in turn, makes their e-wastes a source of composite waste as described herein. Other items, such as spark plugs, transistors and capacitors, which may be present in various electronic and electrical items, are also suitable for use as a composite waste source as described herein.

In this aspect, the composite waste source may be considered as comprising low-, moderate- and high- melting point constituents. Such low-melting point constituents may include plastics, but may also include low-melting point metals such as lead or tin. Moderate-melting point constituents may include metals such as copper, aluminium, zinc, gold, silver, etc. High melting-point constituents may include ceramics such as silica, etc.

The method comprises heating the composite waste to a first temperature zone, such that at least some of the low-melting point constituents in the composite waste are at least partially thermally transformed. In this regard, the low-melting point constituents may be thermally transformed by melting, alloy formation, dissolution and/or phase separation. For example, when tin and/or lead are present, they may become molten or form their alloy, and become recoverable. Plastics, on the other hand, may begin to thermally breakdown. The present method can allow for the recovery of alloys of low-melting point constituents as they form. When the alloys form they are phase separated from the remaining composite waste source. For example, the composite waste source may be located on a mesh conveyor belt, and the alloys of low-melting point constituents may drip through the mesh for recovery in, for example, a collector, whereas the higher-melting point constituents and those constituents that are too viscous to pass through the mesh will remain on top of the conveyor belt.

The method also comprises heating the composite waste in the first temperature zone to a second, higher, temperature zone, such that at least some of the moderate-melting point constituents are at least partially thermally transformed. The moderate-melting point constituents, such as metals, may be at least partially thermally transformed by melting, alloy formation and/or dissolution. This may also allow for the recovery of the generated molten metals or metal alloys of moderate-melting point constituents. For example, when the composite waste source is located on a mesh conveyor belt, the alloys of moderate-melting point constituents may drip through the mesh for recovery in, for example, a collector, whereas the higher-melting point constituents and those constituents that are too viscous to pass through the mesh will continue to remain on top of the conveyor belt. Plastics, on the other hand, may continue their thermal transformation, transforming into gases, such as carbon monoxide and hydrogen, and solid carbon. Additionally, the production of toxic gases, such as dioxins and furans can be minimised by rapidly heating the composite waste source from the first temperature zone to the second temperature zone. Although the generation of toxic gases will likely never be entirely eliminated, the presently disclosed method may minimise their production. Further, known scrubbing or capture techniques can be employed to prevent such gases from escaping into the environment or atmosphere.

At least some of the high-melting point constituents may remain reasonably inert. In this regard, at least some of the high-melting point constituents, such as silica glass fibers, may remain relatively inert, and will tend to remain on top of the mesh conveyor belt.

The method may further comprise heating the composite waste in the second temperature zone to a third, higher, temperature zone, such that the bulk of the moderate-melting point constituents are at least partially thermally transformed. For example, if the third temperature zone corresponds to a temperature of approximately 1100° C., this will result in any remaining copper melting (copper has a melting point of 1085° C.). This will continue to leave high-melting point constituents, such as silica glass fibers, as relatively inert. The glass fibers will continue to remain on top of the mesh conveyor belt and can be collected with any other remaining solids.

If any oxidised copper is present, it may be reduced by the gases, such as CO and $H_2$, and solid carbon generated in the second temperature zone.

The disclosed method may allow for the recovery and reuse of materials which would otherwise be sent to landfill, or incinerated. With key thermal transformation stages occurring in different temperature-time regimes, the stepwise phase separation, partitioning of e-waste constituents and formation of high value products for a wide range of composite waste sources is disclosed. In this regard, a method for the micro-recycling of composite waste, including e-waste, is disclosed. For example, polymer transformations and formation of low-melting point metal alloys, such as tin-lead will occur in a first temperature zone; melting of copper, and dissolution of elements in copper, as well as volatile and gaseous release; and carbon formation of the plastics will occur in a second temperature zone, and completion of the melting of e.g. copper, while relatively high melting point constituents such as silica remain inert on the conveyor belt, will occur in a third temperature zone (e.g. up to about 1250° C.). Each temperature zone can allow the separate capture and recovery of molten metals and alloys specific to that temperature zone. This is contrary to current e-waste recycling methodologies which involve the addition or charging of bulk e-waste into a liquid phase. Known furnaces do not provide the ability to recover metals and alloys progressively from different temperature zones, with the recovered metals and alloys being directly dependent on the temperature of the zone, and the time for which the composite waste source was held at that temperature.

When the composite waste source is located on a mesh conveyor belt, ultra-high-melting point constituents and constituents that are too viscous to pass through the mesh will remain on the belt. Such constituents may include solid carbon generated in the second/third temperature zones, glass fibers, and other ultra-high-melting point constituents such as ceramics including: oxides, such as silica and alumina; and alumina-silicate, etc. For example, when the composite waste source is located on a mesh conveyor belt, the alloys of low- and moderate-melting point constituents may drip through the mesh for recovery in, for example, a collector, whereas the high- and ultra-high-melting point constituents and those constituents that are too viscous to pass through the mesh will continue to remain on top of the conveyor belt. The remaining high-, ultra-high-melting point constituents and viscous constituents of the remaining composite waste source can also be collected and/or recovered for further processing.

Each of the collected respective metals or metal alloys can be further processed to obtain a usable form of the metal, etc., such as further refining processes so the metal can be re-used in the manufacture of metal-containing products.

In a second aspect, a method of processing composite waste is disclosed. The composite waste comprises plastic constituents, metal constituents and ceramic constituents. The method comprises rapidly heating the composite waste to a first temperature zone, such that at least some of the plastic constituents in the composite waste are at least partially thermally transformed. The method further comprises heating the composite waste to a second temperature zone, such that at least some of the metal constituents in the composite waste are at least partially thermally transformed. The ceramic constituents remain reasonably inert.

The method may also comprise heating the composite waste to a third temperature zone, such that thermal transformation of at least some metal constituents is effectively completed, while ceramic constituents in the composite waste remain reasonably inert on top of the mesh conveyor belt.

The plastic constituents may begin to thermally breakdown in the first temperature zone, with thermal transformation into gases and solid carbons occurring in the second and/or third temperature zones. In cases where oxidised copper is present, gases, such as CO and $H_2$, and solid carbon generated in the second temperature zone, may assist in the reduction of oxidised copper.

The metal constituents may be thermally transformed through melting, alloy formation, dissolution and/or diffusion. For example, the affinity of various metals such as tin, lead and nickel, with copper as a solvent could be utilized for their extraction as enriched metallic solid solutions for further refining and processing.

Each temperature zone can allow the separate capture and recovery of molten metals and alloys specific to that temperature zone. This is contrary to known techniques which simply add e-waste to the smelting process, and the constituents become part of the liquid phase.

Prior to rapidly heating the composite waste to the first temperature zone, the composite waste may be pre-heated to a pre-treatment temperature zone, whereby at least some low- melting point metals are at least partially thermally transformed to form metals or metal alloys. Such low-melting point metals may include lead and tin. Again, these low-melting point alloys can be recovered separately to other generated molten metals or metal alloys.

In various aspects of the above methods, the composite waste may be heated to one or more additional temperature zones, with each temperature zone being higher in temperature than the preceding temperature zone. For example, additional temperature zones may be included before, between or after the first, second, third or pre-treatment temperature zones disclosed above. As such, there is a progressive increase in temperatures in the temperature zones. In this regard, specific end products can be both avoided and/or targeted. For example, the formation of different/specific copper alloys, etc. may be targeted at different temperature zones, whilst the temperature in the zones may be controlled so as to minimise the generation of hazardous materials, such as vapourised lead (i.e. above 1250° C.), etc. As such, the method may further comprise collecting at least some of the at least partially thermally transformed constituents at the or each temperature zone. At each specific temperature to which the composite waste is heated, a different/specific alloy can be recovered. In this regard, a method is provided that allows for the controlled recovery of various alloys, in contradistinction to known methods which do not provide the ability to recover metals and alloys progressively from different temperature zones, with the recovered metals and alloys being directly dependent on the temperature of the zone, and the time for which the composite waste source was held at that temperature.

In various aspects of the above methods, heating of the composite waste may be conducted under inert conditions. For example, the composite waste may be heated in a furnace that has been purged with argon, or another inert gas, for the duration of the heating stages. Inert conditions may prevent the oxidation of metals, rare earths and alloys present in the furnace, thereby limiting degradation, chemical transformations and significantly reducing the loss of valuable resources (e.g. metals) to the slag phase. This may be further assisted by the presence of the gases and solid carbon generated in the first or second temperature zones.

In various aspects of the above methods, the composite waste may be roughly chopped, shredded or broken up into smaller pieces prior to heating. Whilst it is not entirely necessary, this can assist in heating the composite waste in a more homogenous manner. Additionally, large parts of the composite waste, such as the housing of a computer or microwave, may first be removed or dismantled for separate recycling. In this manner, the parts of the composite waste (such as printed circuit boards) which have been traditionally difficult to recycle may be isolated for preferential recovery of valuable metals and alloys. The componentry, such as copper wires and semiconductors on printed circuit boards, provides a composite waste source that has a high surface area that can be rapidly heated.

In various aspects of the above methods, the composite waste may be analysed to determine its constituents prior to heating. In this regard, if the various constituents, and ratios of the various constituents, are known, targeted recovery of selected metals and alloys may be possible. This may allow the targeted metals and alloys, and, as such, the temperature zones and heating times, to be selected based on the materials available in the composite waste.

In various aspects of the above methods, the temperature of each temperature zone may be dependent on the constituents of the composite waste, or the metal alloy being targeted for recovery. Similarly, the time for which the composite waste is held at each temperature zone may be dependent on the constituents of the composite waste. In this regard, even if the precise composition of the constituents of the composite waste is not known, if the general type of composite waste is known, it may still be possible to postulate the types of constituents that will likely be present. For example, if the composite waste is a single sided printed circuit board, this is an older generation board which was used in older electronic components, and is relatively paper rich. Multi-layer printed circuit boards, on the other hand, are used in newer generation electronic components and are richer in ceramics and polymers than the older generation boards. This knowledge may be useful in determining the time and temperature characteristics to be used in a given method.

In various aspects of the above methods, the composite waste may be heated in a micro-recycling furnace. The temperature zones may be different regions of the micro-furnace. The micro-recycling furnace may include rapid heating capabilities, for example heating at a rate of about 50-100° C./min or greater. The micro-recycling furnace may also include the ability to heat different zones of the furnace to different temperatures. This can allow the selective and progressive removal and recovery of metals and metal alloys from different temperature zones in the furnace. A micro-recycling furnace may be similar to a horizontal furnace or horizontal tube furnace and may include, for example, a conveyor belt which can allow the composite waste to be moved between temperature zones as and when required. Similarly, a horizontal, or other suitable, furnace may be adapted to implement the method presently disclosed.

The conveyor belt may preferably be in the form of a mesh conveyor belt, which can allow molten metals and/or metal alloys of constituents to drip through the mesh for recovery in, for example, a collector, whereas the higher-melting point constituents and those constituents that are too viscous to pass through the mesh will remain on top of the conveyor belt. The conveyor belt may be manually operated or automated. Each temperature zone of the micro-recycling furnace may preferably include a separate collector for the separate recovery of different metals and/or metal alloys.

Additionally, such micro-recycling furnaces may provide a relatively small, portable and cost-effective furnace that could be deployed locally to process e-waste into high value metals and/or alloys. This could also avoid current practices of transporting large volumes of composite waste long distances to large scale, high cost furnaces, which may not recover sufficient volumes. As the likely resulting metals and/or alloys are niche, high value products, modest volumes of e-waste may prove economically viable, allowing recycling and recovery of metals and/or alloys on a micro-scale.

It should also be appreciated that the presently disclosed method may be adapted to recover only one, or more, metals or metal alloys, depending on the furnace structure available for use, and other economic feasibility factors.

In another aspect, a method of producing a metal alloy from a composite waste source is disclosed. The composite waste source comprises plastic constituents, metal constituents and ceramic constituents. The method comprises a multi-stage heating process including the steps of rapidly heating the composite waste to a first temperature zone, such that at least some plastic constituents in the composite waste are at least partially thermally transformed, and heating the composite waste to a second temperature zone, such that at least some metal constituents in the composite waste are at least partially thermally transformed. In this aspect, some of the metal constituents may be transformed into one or more metal alloys.

In one form, when the metal constituents of the composite waste source include copper, the resulting metal alloy may be a copper-based metal alloy. The method may further comprise the step of heating the composite waste to a third temperature zone, such that remaining copper in the composite waste is melted, and the ceramic constituents remain reasonably inert.

The plastic constituents may be thermally transformed into gases and solid carbons, and may assist in enhancing the reduction of the oxides, such as copper oxides, in the second and/or third temperature zones.

Prior to rapidly heating the composite waste to the first temperature zone, the composite waste may be pre-heated to a pre-treatment temperature zone, whereby low-melting point metals are melted to form metals or metal alloys. Such low-melting point metals may include lead and tin. Again, these low-melting point alloys can be recovered separately to other generated molten metals and alloys.

The method may be otherwise as disclosed in the above aspects.

In yet another aspect, a method of recovering metals from a composite waste source is disclosed. The composite waste source comprises plastic constituents, metal constituents and ceramic constituents. The method comprises a multi-stage heating process including the steps of rapidly heating the composite waste to at least a first temperature zone, such that at least some of the plastic constituents and low-melting temperature metal constituents in the composite waste are at least partially thermally transformed, and heating the composite waste to a second temperature zone, such that at least some moderate-melting temperature metal constituents in the composite waste are at least partially thermally transformed. At least some of the low-melting and moderate-melting temperature metal constituents are recovered, separately, as molten metals and/or metal alloys.

The method may further comprise the step of heating the composite waste to a third temperature zone, such that melting of e.g. copper, is essentially completed, while relatively high melting point constituents such as silica remain inert on the conveyor belt.

The method may be otherwise as disclosed in the above aspects.

An apparatus for the processing of a composite waste source comprising plastic constituents, metal constituents and ceramic constituents, is also disclosed. The apparatus comprises a mesh conveyor belt for progressing the composite waste source through the apparatus. The apparatus also comprises a first temperature zone for heating the composite waste source to a first temperature and a first recovery collector positioned beneath the mesh conveyor belt in the first temperature zone. The first recovery collector collects and recovers molten metals or metal alloys in the first temperature zone which drip through the mesh conveyor belt. The apparatus also comprises a second temperature zone, which is a higher temperature than the first temperature zone, for heating the composite waste source to a second temperature, and a second recovery collector positioned beneath the mesh conveyor belt in the second temperature zone. The second recovery collector collects and recovers molten metals or metal alloys in the second temperature zone which drip through the mesh conveyor belt.

The apparatus is suitable for use as a micro-recycling furnace and, unlike known furnaces, allows the controlled and progressive removal of metal alloys from composite waste sources, such as e-waste, at increasing temperatures.

The apparatus may further comprise at least one additional temperature zone for heating of the composite waste source to at least one additional temperature. For example, additional temperature zones may be included between, before or after the first and second temperature zones disclosed above. The at least one additional temperature zone is higher in temperature than the preceding temperature zone. In this regard, there is a progressive increase in temperatures in the temperature zones moving through the apparatus. An additional recovery collector for each respective additional temperature zone is also provided. The or each additional recovery collector may be positioned beneath the mesh conveyor belt in the additional temperature zone for the collection and recovery of molten metals or metal alloys in the additional temperature zone.

In one embodiment, the speed of the mesh conveyor belt may be variable. This can allow length of time taken for the composite waste source to move through a given temperature zone to be varied. This can also assist in holding the composite waste source at a given temperature to preferentially form a given metal alloy.

In one embodiment, operation of the mesh conveyor belt may be automated. In other embodiments, the mesh conveyor belt may be manually operated. This may allow existing furnaces to be retro-fitted with appropriate equipment to allow the processing of composite waste sources along with the recovery of at least one metal alloy. Additionally, this may be useful in developing regions where existing furnaces are being modified, and the cost of automated apparatus' and/or conveyor belts may be prohibitive to implementation.

In one embodiment, the heating rate of each temperature zone in the apparatus may be variable. This can allow moderate or rapid increases in temperature to be achieved, depending on whether particular temperature ranges are to be avoided. For example, in order to minimise the generation of dioxins and furans, the temperature range of approximately 350° C. to about 850° C. may want to be avoided. A higher heating rate may be used when transitioning from a first temperature zone (up to about 350° C.) to a second temperature zone (at about 850° C.), than transitioning from the second temperature zone to a third temperature zone (at about 1250° C.), where there is no need to avoid any temperatures (i.e. there is no need to avoid temperatures between about 850° C.-1250° C.; however, temperatures above 1250° C. should be avoided to minimise vapourisation of lead).

In one embodiment, the temperature of each temperature zone may be variable. By providing a temperature zone that can be varied, the metal alloys being targeted can be varied.

In some embodiments, heating of each temperature zone in the apparatus may be by natural gas. This can allow accurate control of both the heating rate and temperature. In some forms, each temperature zone may be heated from above the mesh conveyor belt.

In some forms, the apparatus may further comprise a solids recovery collector for the recovery of solids remaining on the mesh conveyor belt once heating at a final temperature zone is completed. This can allow the remaining ultra-high temperature constituents of the composite waste source to be recovered for further processing.

In some forms, the apparatus may be operated under inert conditions. For example, the apparatus may be purged with argon, or another inert gas, for the duration of the heating stages in the various temperature zones. Inert conditions may prevent the oxidation of metals, rare earths and alloys present in the furnace, thereby limiting degradation, chemical transformations and significantly reducing the loss of valuable resources (e.g. metals) to the slag phase.

The disclosed apparatus may be employed in carrying out the methods described above.

A system for the processing of a composite waste source comprising plastic constituents, metal constituents and ceramic constituents, is also disclosed. The system comprises a mesh conveyor belt, for progressing the composite waste source through at least first and second temperature zones in the system, and at least first and second recovery collectors. Each collector is, respectively, positioned beneath the mesh conveyor belt in the first and second temperature zones for the collection and recovery of molten metals and/or metal alloys in the first and second temperature zones. The second temperature zone has a higher temperature than the first temperature zone. The system is suitable for use as a micro-recycling furnace in the recycling of composite waste sources, such as e-waste. Unlike known systems, the presently disclosed system allows the controlled and progressive removal of metals or metal alloys at increasing temperatures, via the solid state addition of the composite waste source only to a furnace.

In some forms the system may further comprise at least one additional temperature zone for heating the composite waste source. The additional temperature zones may be included before, between or after the first or second temperature zones disclosed above. The at least one additional temperature zone may be higher in temperature than the preceding temperature zone in the system. In this regard, there is a progressive increase in temperatures in the temperature zones moving through the system. An additional recovery collector for each respective additional temperature zone may also be provided, and positioned beneath the mesh conveyor belt in the respective additional temperature zone for collection and recovery of molten metals or metal alloys in the additional temperature zone. The inclusion of additional temperature zones and additional recovery collectors can assist in the targeted recovery of additional metals and/or metal alloys.

In some forms, the speed of the mesh conveyor belt may be variable. This can allow length of time taken for the composite waste source to move through a given temperature zone to be varied, which can assist in holding the composite waste source at a given temperature to preferentially form a given metal or alloy.

In some forms, operation of the mesh conveyor belt may be automated. In other embodiments, the mesh conveyor belt may be manually operated. This may allow existing furnaces to be retro-fitted with appropriate equipment to allow the processing of composite waste sources along with the recovery of at least one metal or alloy. Additionally, this may be useful in developing regions where existing furnaces are being modified, and the cost of automated systems and/or conveyor belts may be prohibitive to implementation.

In some embodiments of the system, the heating rate of each temperature zone may be variable. In a manner similar to that described in relation to the apparatus above, this can allow moderate or rapid increases in temperature to be achieved, depending on whether particular temperature ranges are to be avoided.

In some embodiments of the system, the temperature of each temperature zone may be variable. The provision of a variable temperature zone can vary the metal alloys being targeted for recovery.

In some embodiments, heating of each temperature zone in the system may be by natural gas. This can allow accurate control of both the heating rate and temperature. In some forms, each temperature zone may be heated from above the mesh conveyor belt.

In some forms, the system may further comprise a solids recovery collector for the recovery of solids remaining on the mesh conveyor belt once heating at a final temperature zone is completed. This can allow the remaining ultra-high temperature constituents of the composite waste source to be recovered for further processing.

In some forms, the system may be operated under inert conditions. For example, the system may be purged with argon, or another inert gas, for the duration of the heating stages in the various temperature zones. Inert conditions may prevent the oxidation of metals, rare earths and alloys present in the furnace, thereby limiting degradation, chemical transformations and significantly reducing the loss of valuable resources (e.g. metals) to the slag phase.

The apparatus disclosed above, may be employed in the disclosed system. Similarly, the disclosed system may be employed to carry out the methods described above.

BRIEF DESCRIPTION OF THE DRAWING

Notwithstanding any other forms which may fall within the scope of the method, apparatus and system as set forth in the Summary, specific embodiments will now be described, by way of example only, with reference to the accompanying drawing in which.

DETAILED DESCRIPTION

Figure 1:
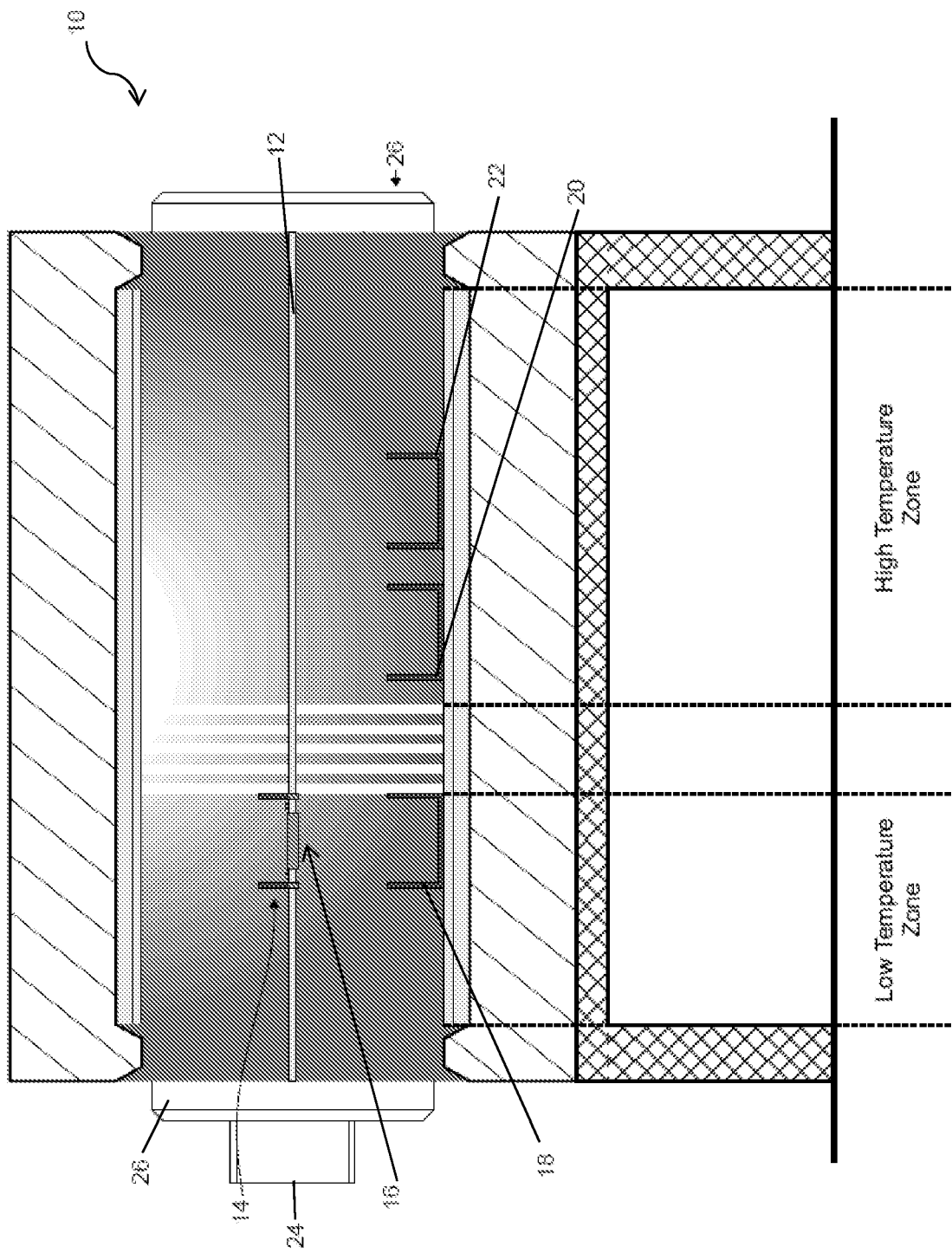
FIG. 1 shows a schematic micro-recycling furnace used in accordance with an embodiment of the method, system and apparatus disclosed.

A schematic diagram of a micro-recycling furnace 10, is shown in FIG. 1. The micro-recycling furnace 10 includes a conveyor belt 12 that allows a composite waste source to move from low to high temperature zones in the furnace. The micro-recycling furnace 10 also includes a receptacle 14, such as a hot working stage, to hold the composite waste source, although it should be appreciated that in some forms the composite waste source may be placed directly onto the conveyor belt 12, such as if the conveyor belt is a mesh, or if portions of the conveyor belt are a mesh or sieve.

The receptacle 14 may include a sieve or mesh base 16, which can allow molten materials to pass therethrough for collection and subsequent processing, if appropriate. The micro-recycling furnace 10 of FIG. 1 is shown having three recovery collectors 18, 20 and 22, for this purpose. It should be appreciated that there may only be two such collectors, or there may be additional such collecters (not shown).

The micro-recycling furnace 10 shown includes an automated motion system 24 to automatically operate conveyor belt 12, to cause it to move the receptacle 14 into different temperature zones within the furnace 10. It should be appreciated that the automation of the conveyor belt 12 may still be subject to specific parameters, such as conveyor belt speed, or length of time that the conveyor belt is to remain in a specific temperature zone, and that these parameters may be entered into a control program for the automated motion system. It should also be appreciated that in alternative forms, the conveyor belt 12 may be manually operated, thus eliminating the need for the shown automated motion system 24.

The micro-recycling furnace 10 is also shown having a gas scrubber 26, to remove gaseous releases generated during use of the furnace 10.

Figure 2A:
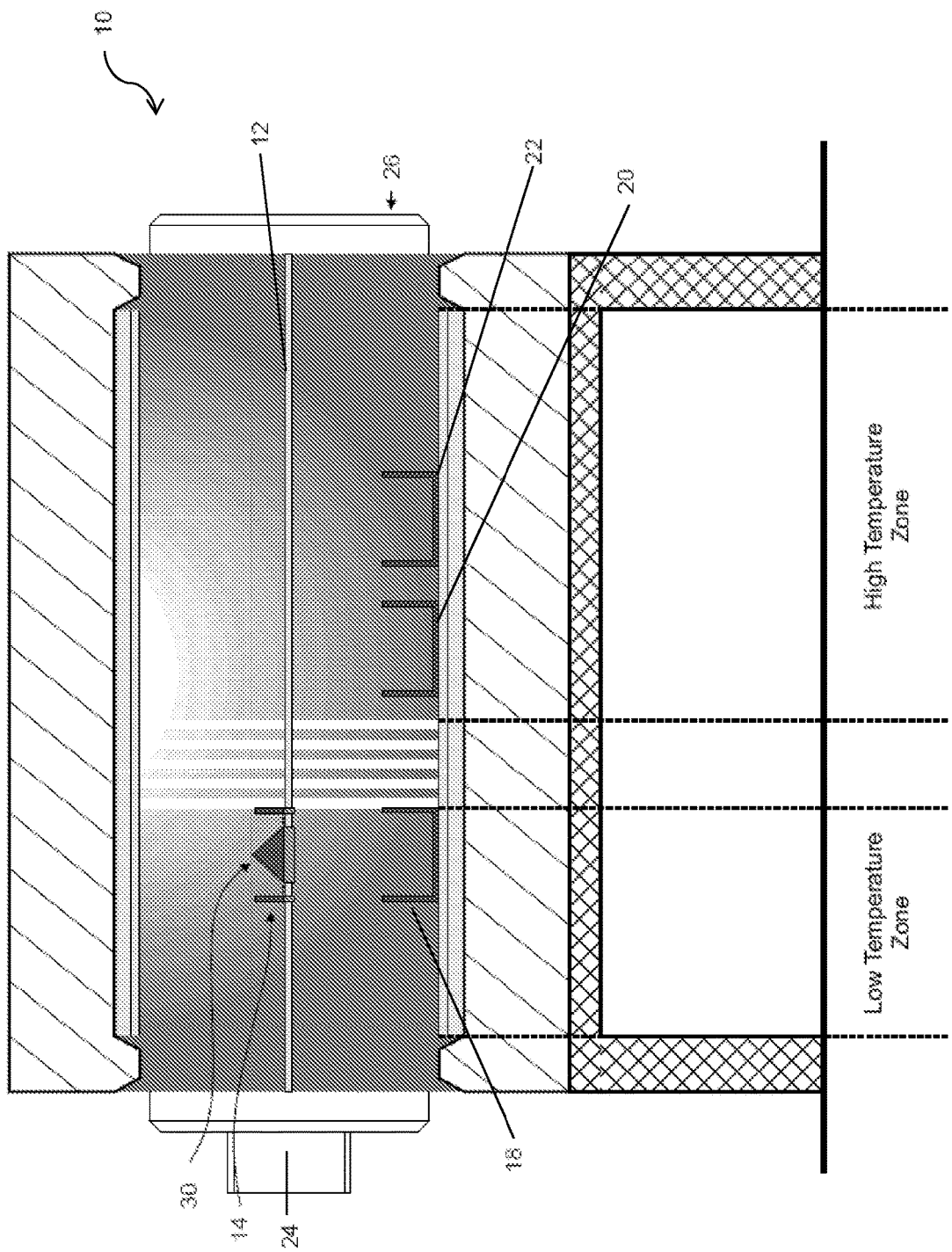
FIGS. 2A to 2G show the schematic micro-recycling furnace of FIG. 1 in use, in accordance with an embodiment of the method, system and apparatus disclosed.
Figure 2B:
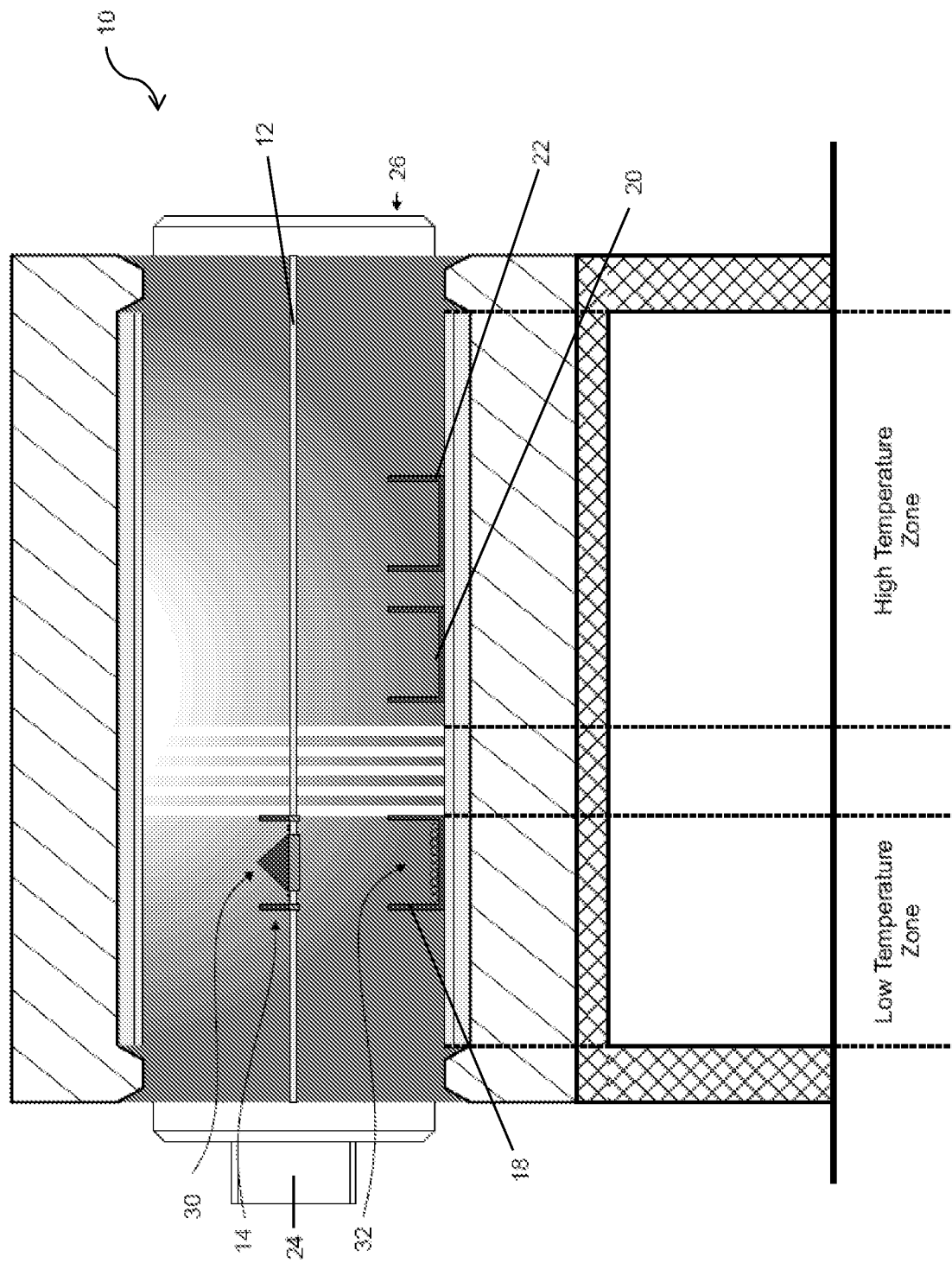
Figure 2C:
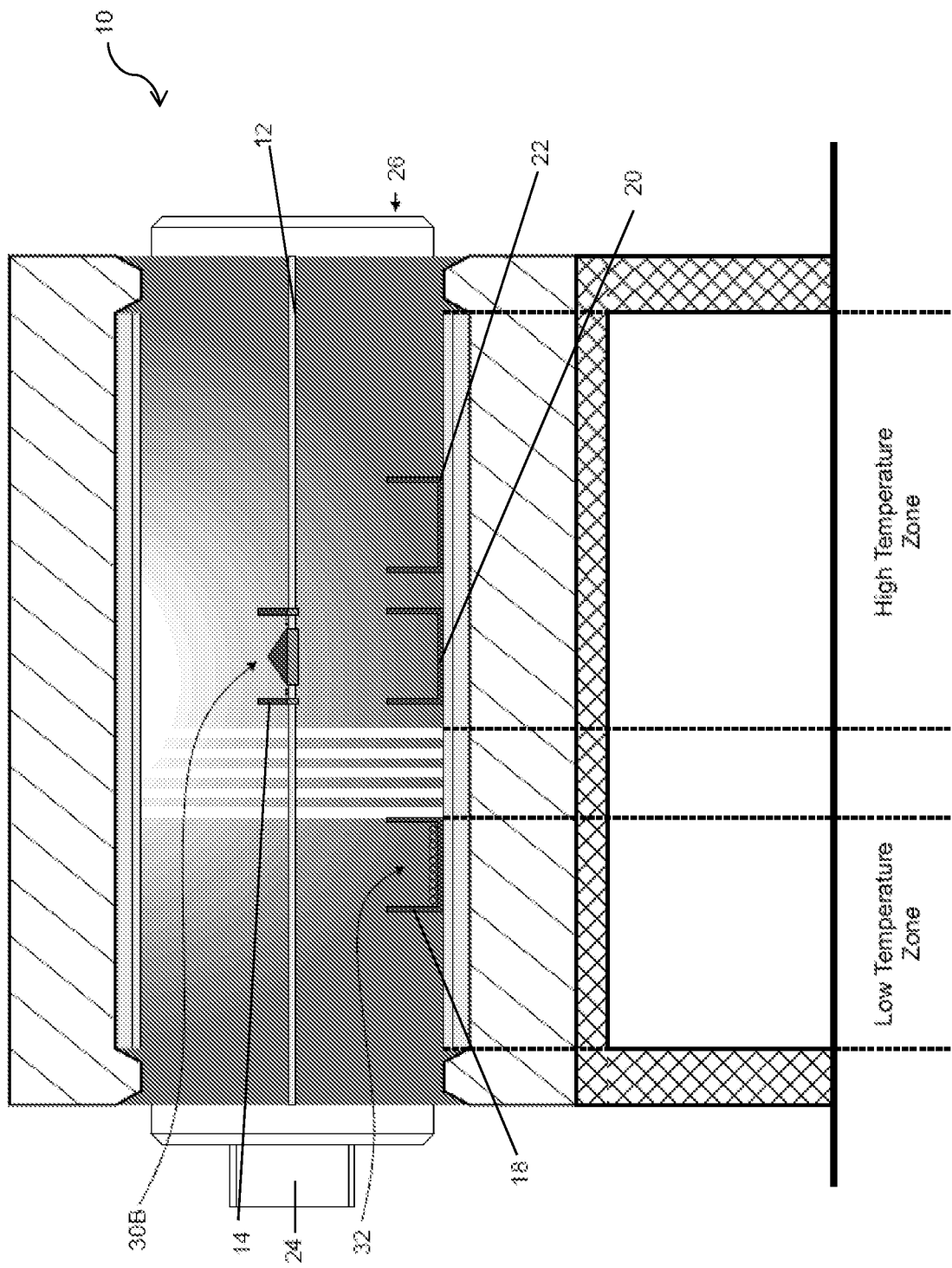

Reference is now made to FIGS. 2A to 2G, which show some exemplary sequential stages of the micro-recycling furnace 10 in use. FIG. 2A shows micro-recycling furnace 10 of FIG. 1, with a composite waste 30 on the sieve base 16 of receptacle 14, located in the low temperature zone of the furnace 10. After a period of time in the low temperature zone, and as shown in FIG. 2B, molten material 32 passes through the sieve base 16 of FIG. 1, and is collected in the first recovery collector 18.

Figure 2D:
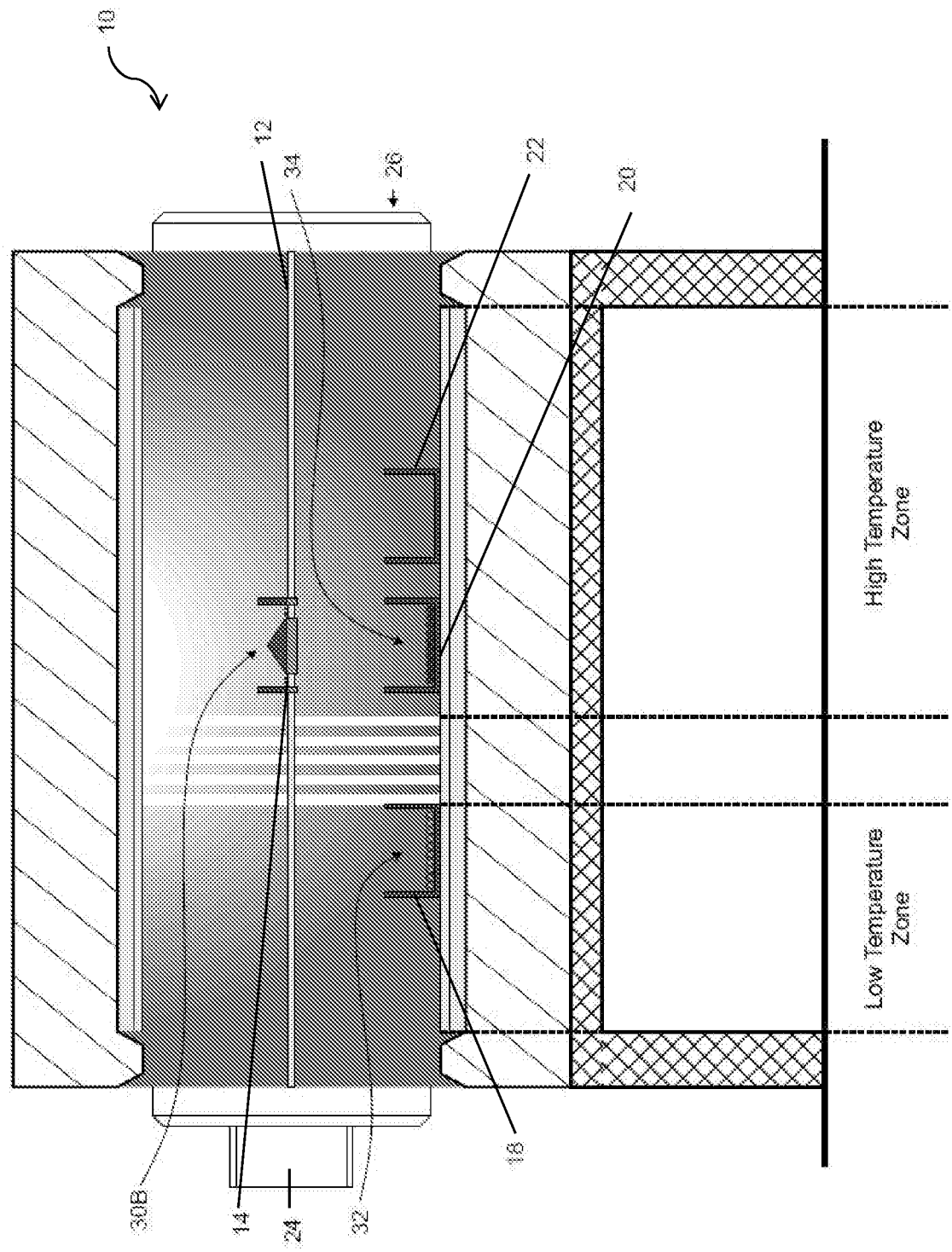

The conveyor belt 12 then moves the receptacle 14 to a first position in the high temperature zone. The temperature in this first position is higher than the temperature in the low temperature zone. Because of the recovery of molten material 32, the volume of composite waste 30 has reduced, with the reduced volume of composite waste 30B shown in the receptacle 14 of FIG. 2C. After a period of time in this first position of the high temperature zone, and as shown in FIG. 2D, molten material 34 passes through the sieve base 16 of FIG. 1, and is collected in the second recovery collector 20.

Figure 2E:
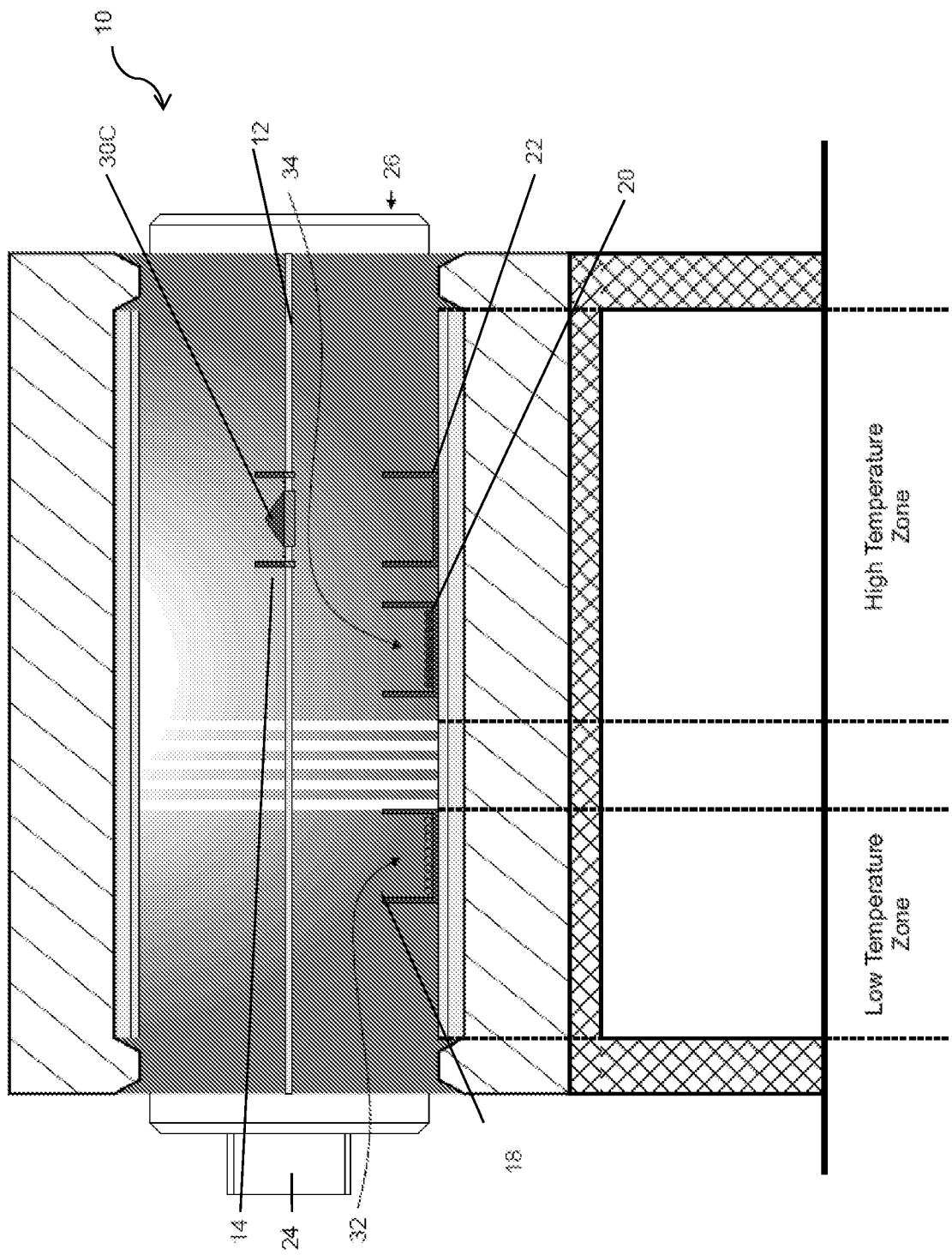
Figure 2F:
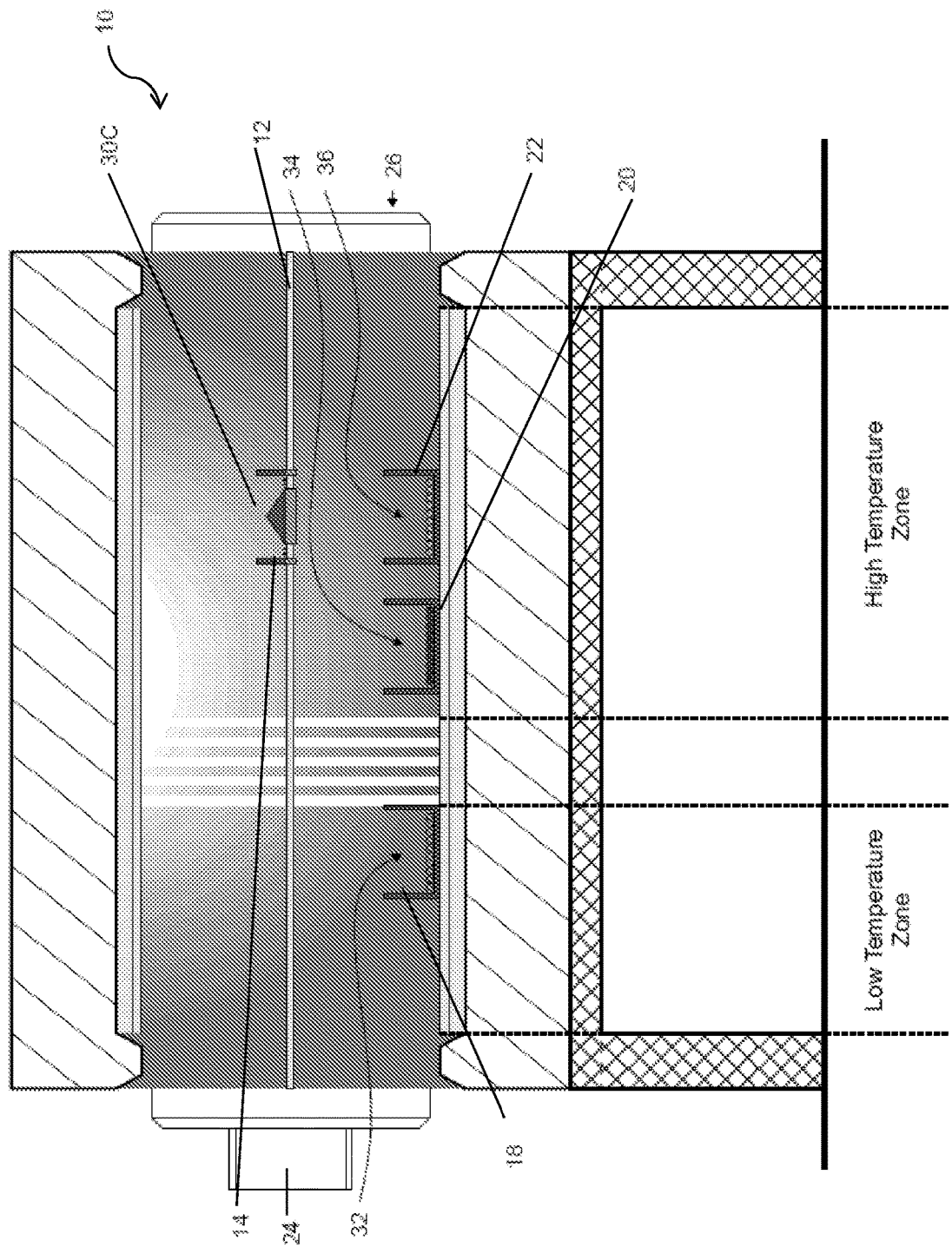
Figure 2G:
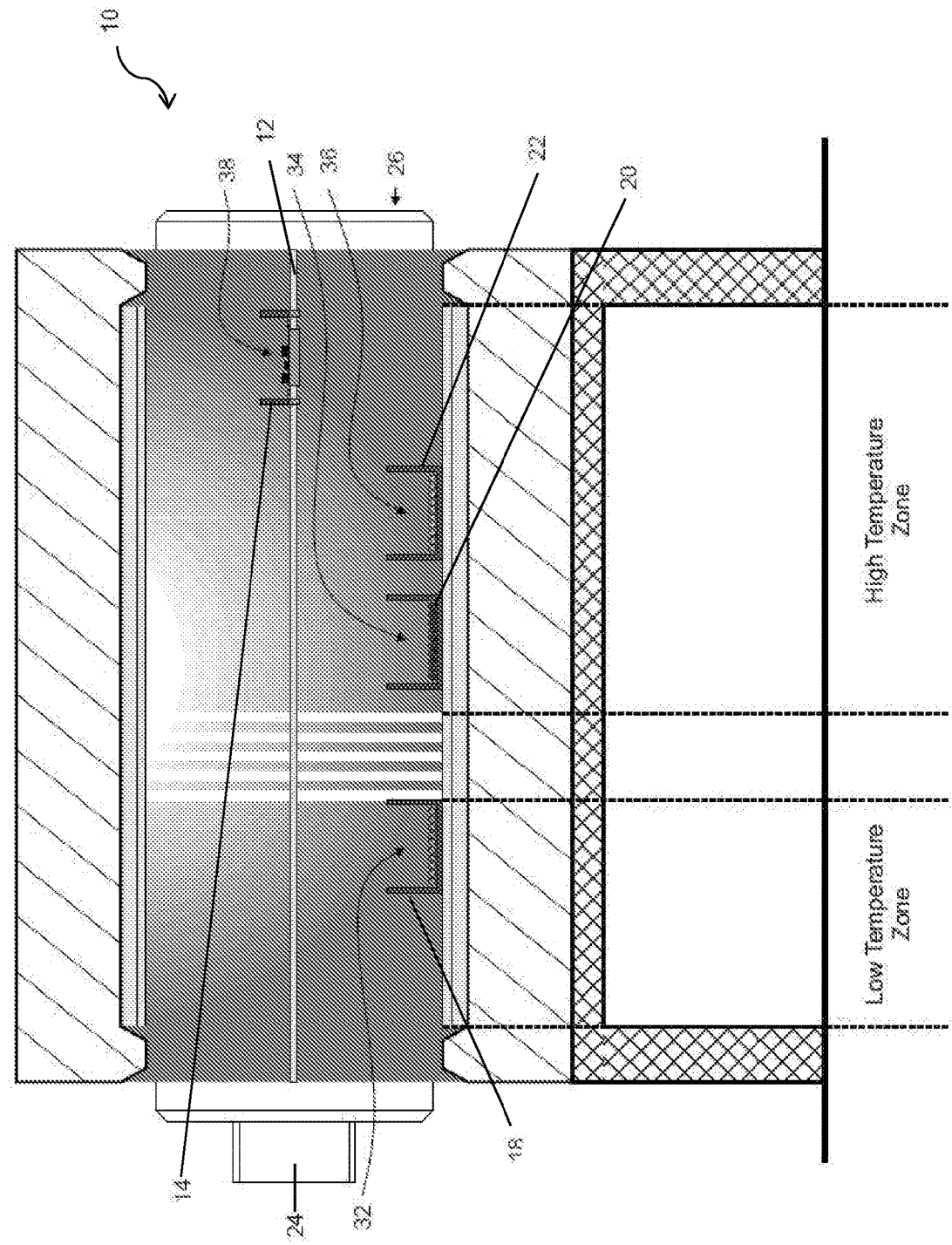

The conveyor belt 12 again moves the receptacle 14 to a second position in the high temperature zone (see FIG. 2E). The temperature in this second position of the high temperature zone is higher than the temperature in the first position of the high temperature zone and higher than the temperature in the low temperature zone. After a period of time in this second position of the high temperature zone, and as shown in FIG. 2F, molten material 36 from the composite waste 30C passes through the sieve base 16 of FIG. 1, and is collected in the second recovery collector 22.

Once the recovery processes have completed, the conveyor belt 12 can again move the receptacle 14, with any other leftover materials 38 which did not melt at the selected temperature zones remaining in the receptacle 14. This leftover material 38 may also be collected, e.g. for discarding, disposal, or collection and further processing. The micro-recycling furnace 10 provides a safe and sustainable solution for processing composite waste that also contains toxic waste and metals.

Low melting-point materials, such as lead or tin, may form an alloy 32 or molten metal at relatively low temperature zones. It should also be appreciated that low melting-point materials, such as lead, may also form an alloy 34 at a relatively moderate temperature zone. For example, even though different lead alloys (such as lead-tin, or copper-lead) may form at a variety of temperatures (between about 250° C.-350° C., and 350° C.-1250° C., respectively), specific alloys may be preferred to remove lead from the system. For example, formation of lead-tin alloys at 250° C.-350° C. may be preferred to remove lead at a lower temperature and minimise the amount of lead in the system at higher temperatures, such as when the reactivity of copper is higher, or the possibility of lead vapourisation is higher. The removal and recovery of lead in alloyed form may, in this regard, reduce the potential environmental impact.

It should also be appreciated that in selecting the temperature zones, heating rates and time spent at various temperatures, one goal may be to remove a significant portion of e.g. lead at relatively low and moderate temperature zones, to recover leaded alloys separately and minimise the lead from becoming part of other alloys, such as copper, being recovered. In this regard, it may be necessary to increase the time spent at a particular temperature in a relatively low to moderate temperature zone in order to remove the majority of lead from the composite waste source. As such, the composite waste source may be judiciously selected so that sources with relatively higher lead contents (such as older-style printed circuit boards) are processed at the same time.

As will be readily understood by those skilled in the art, the rationale behind removing as much lead as possible in the low and moderate temperature zones is to minimise the amount of lead left in the composite waste source 30 when the furnace temperature is being increased to a temperature at which lead vapourises. However, as will also be appreciated by those skilled in the art, there are known scrubbing or capture techniques that can be employed to prevent such gases from escaping into the environment or atmosphere, should lead vapourise. For example, a gas scrubber 26 may be employed with the micro-recycling furnace 10 to remove gaseous releases generated during processing.

Another goal in selecting the temperature zones, heating rates and time spent at various temperature zones, may be to maximise the reactivity of, for example, copper. In this regard, the goal may be to prevent copper from melting out, so that if there is lead or tin in the system, they will form alloys with copper, such as the material recovered as material 34. By tailoring the temperature zone, the percentage of, for example, tin in the copper alloy can be altered.

Another goal in selecting the temperature zones, heating rates and time spent at various temperature zones, may be to minimise the production of toxic gases, such as dioxins and furans.

At moderate temperatures, plastics in the composite waste source will also continue to undergo phase transformations, with volatile and gaseous release, and solid carbon formation.

With further increases in temperature, high-melting point constituents, such as silica, in the form of glass fibers, will remain generally inert while any remaining copper will melt. In this regard, the copper will melt through the mesh/sieve base 16 of conveyor belt 12 as material 36, while the glass fibers will remain on top of the mesh conveyor belt, and be part of other leftover materials 38 which also did not melt at the selected temperature zones.

The leftover materials 38 can also be recovered, for disposal or for further use or processing. For example, if the leftover materials 38 are high in carbon, they may be employed as a carbon source for other metallurgical processes (such as ferro-alloy production or smelting). Even if the leftover materials 38 are unable to be used, the amount of leftover material 38 will be significantly less than the starting composite waste source 30, resulting in significantly less bulk material being sent to landfill.

Additionally, recovery of materials 32, 34 and 36 has allowed the reclamation of valuable resources which may be rare, expensive or otherwise pose an environmental risk. Furthermore, it is generally accepted that the recycling of metals and metal alloys is more energy efficient, and leads to reduced energy consumption in the manufacturing of metals when recycling is compared to the manufacture of metals from ores. In this regard, the method, system and apparatus disclosed herein may be considered to be a "micro-factory" for the creation of resources from waste, that provides a safe and sustainable solution for the localised processing and toxic composite waste that contains metals.

EXEMPLARY METHOD

A non-limiting exemplary method for the processing of a composite waste source will now be described with reference to FIG. 1. In this exemplary method, the composite waste source comprised a mixture of electronic components such as mobile (cell) phones, e-readers, DVD players and televisions. In order to increase the recovery of various metal alloys, it was determined that the covers and cases of the electronic components should be removed to minimise dilution of the metals during processing. In this regard, a fragmenter was used to pull the mobile (cell) phones, e-readers, DVD players and televisions apart to separate the plastic casings from the circuit boards and other recoverable componentry of the devices. The plastic casings were able to be recycled in a separate process, using known technologies.

The printed circuit boards and other recoverable componentry of the devices were then broken down into smaller chunks of board and componentry, forming the composite waste source 30. The composite waste source 30 was placed on the mesh base 16 of receptacle 14 on conveyor belt 12, and the first temperature zone was heated to about 325° C., and held at this temperature for about 60 minutes. A molten material 32 was observed to drip through the mesh base 16 of receptacle 14, and was collected in a first recovery collector 18.

After about 60 minutes, the conveyor belt 12 was moved so that the remaining composite waste source 30B was positioned in the second temperature zone. The temperature in the second temperature zone was rapidly increased to above about 900° C., and held at this temperature for about 30 minutes. The temperature was increased at a rate of about 50-100° C./min or greater, in order to minimise the production of dioxins and furans which occurs at temperatures between about 350-850° C. A molten material 34 was again observed to drip through the mesh base 16 of receptacle 14, and was collected in a second recovery collector 20 positioned in the second temperature zone. The formation of gases were also observed. The gas scrubber 26 removed the gases generated from the micro-recycling furnace 10 during the process.

After about 30 minutes, the conveyor belt 12 was again moved so that the receptacle 14 with the remaining waste source 30C was positioned in the third temperature zone. The temperature in the third temperature zone was increased to about 1100° C., and was held at this temperature for about 30 minutes. A molten material 36 was again observed to drip through the mesh base 16 of receptacle 14, and was collected in a third recovery collector 22 positioned in the third temperature zone.

Recovered materials 32, 34 and 36 were removed separately and taken for further processing to complete the recycling and refinement of the metal alloys. The leftover material 38 was also removed and processed to recover valuable materials.

It was observed that the disclosed solid-state process provided a simple method for the micro-recycling of composite waste sources, that didn't require the manual separation of many different types of materials or the use of smelting technologies of known processes. This process not only had the effect of providing a safe and sustainable solution for the recycling of toxic composite waste containing materials, it was also a micro-factory that allowed the creation and recovery of resources from that waste.

Whilst a number of specific embodiments have been described, it should be appreciated that the methods, apparatus and system may be embodied in many other forms. For example: modifications may be made to the heating rate used to heat the composite waste source to the desired temperature zone; a different type of furnace, such as a horizontal furnace, may be employed; the recovery of certain metals or metal alloys may be preferred, which may alter the preferred temperatures of the temperature zones; additional or fewer temperature zones may be employed, depending on which materials are being targeted for recovery; the length of time required at a specified temperature may vary, depending on which materials are being targeted for recovery or the constituents present in the composite waste source; etc.

In the claims which follow, and in the preceding description, except where the context requires otherwise due to express language or necessary implication, the word "comprise" and variations such as "comprises" or "comprising" are used in an inclusive sense, i.e. to specify the presence of the stated features but not to preclude the presence or addition of further features in various embodiments of the method, apparatus and system as disclosed herein.

The invention claimed is:

1. A method of processing electronic waste comprising plastic constituents, metal constituents and ceramic constituents, the method comprising:
   heating the electronic waste in a first temperature zone to a first temperature of up to 350° C.; and
   heating the electronic waste from the first temperature zone in a second temperature zone to a second temperature of at least 850° C. at a rate of about 50° C./min or greater such that at least some of the metal constituents in the electronic waste are at least partially thermally transformed by melting, alloy formation and/or dissolution,
   wherein heating the electronic waste in the first temperature zone and the second temperature zone occurs in a gas furnace,
   wherein the electronic waste is not heated above a temperature of 1250° C. such that lead is not vaporized, and
   wherein at least some of the metal constituents are transformed into a metal alloy.

2. The method of claim 1 wherein at least some of the plastic constituents in the electronic waste are at least partially thermally transformed into gases and solid carbon in the second temperature zone.

3. The method of claim 2 wherein the gases assist in the reduction of any copper oxides present in the second temperature zone.

4. The method of claim 2, wherein the gases include carbon monoxide and hydrogen.

5. The method of claim 1 wherein, prior to heating the electronic waste to the first temperature, the electronic waste is pre-heated in a pre-treatment temperature zone to a pre-treatment temperature that is lower than the first temperature.

6. The method of claim 5, wherein at the pre-treatment temperature zone at least some low-melting point metal constituents are transformed into metal alloys.

7. The method of claim 6, wherein the at least some low-melting point metal constituents include lead and tin.

8. The method of claim 1 further comprising the step of heating the electronic waste in at least one additional temperature zone to at least one additional temperature, wherein the temperature in the at least one additional temperature zone is a higher temperature than the preceding temperature zone.

9. The method of claim 1 further comprising collecting at least some of the at least partially thermally transformed metal constituents at the second temperature zone.

10. The method of claim 1 wherein the method is conducted under inert conditions.

11. The method of claim 1 wherein the electronic waste is analysed to determine its constituents prior to heating.

12. The method of claim 1 wherein at least some of the metal constituents are recovered as molten metals and/or metal alloys.

13. The method of claim 1, wherein in the step of heating the electronic waste from the first temperature zone in the second temperature zone to the second temperature the temperatures in the zones avoid a temperature range of greater than 350° C. – less than 850° C.

14. The method of claim 1, wherein the gas furnace uses a natural gas.

15. The method of claim 1 wherein, the metal constituents include copper, and the metal alloy is a copper-based metal alloy.

16. The method of claim 15 further comprising the step of:
   heating the electronic waste to a third temperature in a third temperature zone, such that remaining copper in the electronic waste is melted.

* * * * *